United States Patent [19]

Moxness et al.

[11] Patent Number: 5,017,236
[45] Date of Patent: May 21, 1991

[54] HIGH FREQUENCY SONIC SUBSTRATE PROCESSING MODULE

[75] Inventors: Sherman U. Moxness, Golden Valley; Robert W. Grant, Excelsior, both of Minn.

[73] Assignee: FSI International, Inc., Chaska, Minn.

[21] Appl. No.: 396,116

[22] Filed: Aug. 21, 1989

[51] Int. Cl.⁵ .............................................. B08B 7/00
[52] U.S. Cl. ........................................ 134/1; 134/184
[58] Field of Search ............................ 134/1, 134, 184

[56] References Cited

U.S. PATENT DOCUMENTS

| | | | |
|---|---|---|---|
| 3,893,869 | 7/1975 | Mayer et al. | 134/86 |
| 4,118,649 | 10/1978 | Shwartzman et al. | 310/337 |
| 4,326,553 | 4/1982 | Hall | 134/153 |
| 4,461,651 | 7/1984 | Hall | 134/1 |
| 4,543,130 | 9/1985 | Shwartzman | 134/1 |
| 4,736,760 | 4/1988 | Coberly et al. | 134/134 |
| 4,763,677 | 8/1988 | Miller | 134/1 |
| 4,804,007 | 2/1989 | Bran | 134/184 |

Primary Examiner—Asok Pal
Attorney, Agent, or Firm—Faegre & Benson

[57] ABSTRACT

A single substrate high frequency sonic processing module uses a substrate chamber dimensionally sized to the substrate for immersing the substrate in processing solution. Sonic wave permeable membranes form two ends of the substrate chamber along a sonic wave path therethrough. A sonic wave generated by a transducer external to the substrate chamber, travels through sonic wave conducting liquid in contact with the first membrane, external to the substrate chamber. The liquid is shaped by a sonic wave guide of continuously diminishing cross sectional area along the sonic wave path therethrough, thus intensifying and concentrating the sonic wave entering the substrate chamber. The sonic wave passes through the second membrane to a sonic absorbing and dissipating ante chamber. A method for sonic processing of substrates is disclosed. The individual sonic processing modules are combined into a single system for simultaneously processing plural substrates. The minimal sized substrate chamber provides effective processing with minimal processing solution, minimizing cost and disposal. The shaped wave guide concentrates and intensifies the sonic wave guide to provide enhanced processing.

31 Claims, 1 Drawing Sheet

HIGH FREQUENCY SONIC SUBSTRATE PROCESSING MODULE

FIELD OF THE INVENTION

This invention relates to a module for liquid processing of substrates, such as semiconductor wafers or other such items, using high frequency sonic wave energy, including megasonic or ultrasonic wave energy. More particularly, this invention relates to a high frequency sonic processing module, wherein the high frequency sonic wave generating transducer is maintained outside the substrate chamber, protected from the effects of the harsh processing solutions, and wherein a specifically shaped wave guide is used to concentrate and intensify the sonic waves generated by the transducer. In order to provide uniformity of process conditions, techniques and results, the module is specifically designed to process a single wafer substrate. The process chamber itself is closely sized to the dimensions of the single wafer substrate. Thus, smaller quantities of processing solutions, provided fresh for each wafer, can be used, additionally providing savings in the cost of the processing solutions and disposal of waste processing solutions, while insuring optimum effectiveness in the processing procedure. To provide for processing a plurality of wafer substrates simultaneously, a plurality of such individual megasonic processing modules may be incorporated into a single system.

BACKGROUND OF THE INVENTION

The current trend in the computer industry toward smaller IC device features, necessitated by more complex, cost effective and higher speed circuits is well known. The corresponding requirements in terms of surface preparation and processing have also changed at an even faster rate. For example, as photolithographic features shrink below one micron, and depth-to-width ratios increase, wafer cleaning and drying in these feature "trenches" becomes a process limiting factor. Reduction of particulate and minimizing particulate contribution of the equipment itself becomes more increasingly important. Sonic wave energy has demonstrated an ability to enhance the effectiveness of liquid processing solutions to reduce particulate in many cases due to micro cavitation or shear forces. Processing enchancement techniques in the form of high frequency sonic wave energy in combination with established chemistries is thus provided by the present invention to meet these needs.

In the areas of production and process control, single substrate wafer handling provided by the present novel sonic processing module, method and system provides distinct advantages over previously available sonic processing techniques in uniformity of environment, exposure to processing, using minimal amounts of processing solution, and processing results. In the single wafer process module of this invention, control of processing liquid and sonic wave energy flow can be easily repeated and uniformly applied. The single wafer is supported within the chamber on its periphery to minimize surface contact and have both surfaces exposed to the processing solution and the sonic wave. Further, according to the present invention, a plurality of the presently disclosed individual modules can be combined to provide a single sonic processing system to provide for simultaneously processing a plurality of wafer substrates. In addition, automation of process information, and wafer identification tracking can be accomplished easily in the random access, single wafer process.

There have previously been available techniques for processing semiconductor wafers and other substrates immersed in liquid processing solution with the use of sonic energy. Descriptions of megasonic processing apparatus and methods are found in U.S. Pat. Nos. 3,893,869; 4,099,417; 4,118,649; 4,326,553; 4,543,130; 4,736,760 and 4,804,007. While these previously available sonic processing apparatus and methods have been satisfactory in some respects, there is still need for improvements, particularly in protecting the sonic wave generating source from the harsh liquid chemical processing environment, in amplifying and concentrating the sonic wave energy to enhance its processing effect, in minimizing the size of the process chamber itself, and in terms of the other needs of the computer industry discussed herein above.

SUMMARY OF THE INVENTION

The high frequency sonic processing module for processing substrates, such as semiconductor wafers, according to the present invention comprises a substrate chamber closely sized to the dimensions of the wafer substrate for maintaining the substrate immersed in liquid processing solution. The substrate chamber is provided with membranes which form both ends of the chamber along the path of the sonic wave through the chamber. These membranes are inert to the processing solutions and provide maximum transmittance of the sonic wave therethrough. The sonic wave generating transducer is outside the substrate chamber, protected from the harsh processing solutions. The high frequency sonic wave energy generated by the transducer is directed through a liquid medium shaped by a sonic wave guide to intensify and concentrate the sonic wave. The high frequency sonic wave used in the present module is generally above about 600 kilohertz up to about 2000 kilohertz. The wave guide is shaped to be of cross sectional area which gradually decreases along its length, in the direction of travel of the sonic wave therethrough, and is filled with liquid medium, such as DI water or similar inert sonic wave conducting liquid having a density essentially the same as that of the processing solution. The wave guide may suitably be a funnel shape or any similar shape whose cross sectional area gradually decreases along its length in the direction of travel of the sonic wave. Because of the decreasing shape of the wave guide, the sonic waves are intensified and concentrated for as much as 5–15 times the power per unit area initially generated. This is a substantially higher wave energy than that generated in other previously available sonic cleaning apparatus. The shaped sonic wave guide is positioned in contact with the first membrane of the substrate chamber, so that the sonic wave energy is transmitted directly from the fluid in the wave guide through the first membrane to the processing fluid in the substrate chamber.

The first membrane of the substrate chamber permits the sonic wave to be transmitted from the inert liquid medium within the wave guide to the liquid processing solution and the substrate immersed therein. The second membrane permits the sonic wave energy, after contacting the substrate within the liquid processing solution to be transmitted to a sonic absorbing compartment. The sonic absorbing compartment is filled with material that absorbs and dissipates the remaining sonic wave energy, such as beads, brushes or fibers in DI water to further dissipate any residual heat.

The module of the present invention is specifically designed to maintain a single substrate or wafer within the substrate chamber, with the substrate chamber minimally sized to the dimensions of the substrate wafer. The wafer is supported by its periphery with both surfaces exposed to the processing solution and to the sonic wave, and is positioned so that the megasonic wave travels across essentially the entire substrate exterior.

The substrate chamber has appropriate inlet and outlet ports for processing solution and water. Since the presence of bubbles is known to inhibit sonic wave travel, the inlet ports are provided with manifolds with appropriate baffles to evenly distribute the fluid flow across the substrate and to avoid stagnation areas within the chamber. The ports may be reversible inlet/outlet ports.

The apparatus of the present invention uses a closed environment, which allows higher temperatures and pressures than has been previously possible and consequently results in higher processing efficiency.

DETAILED DESCRIPTION OF THE INVENTION

Figure 1:
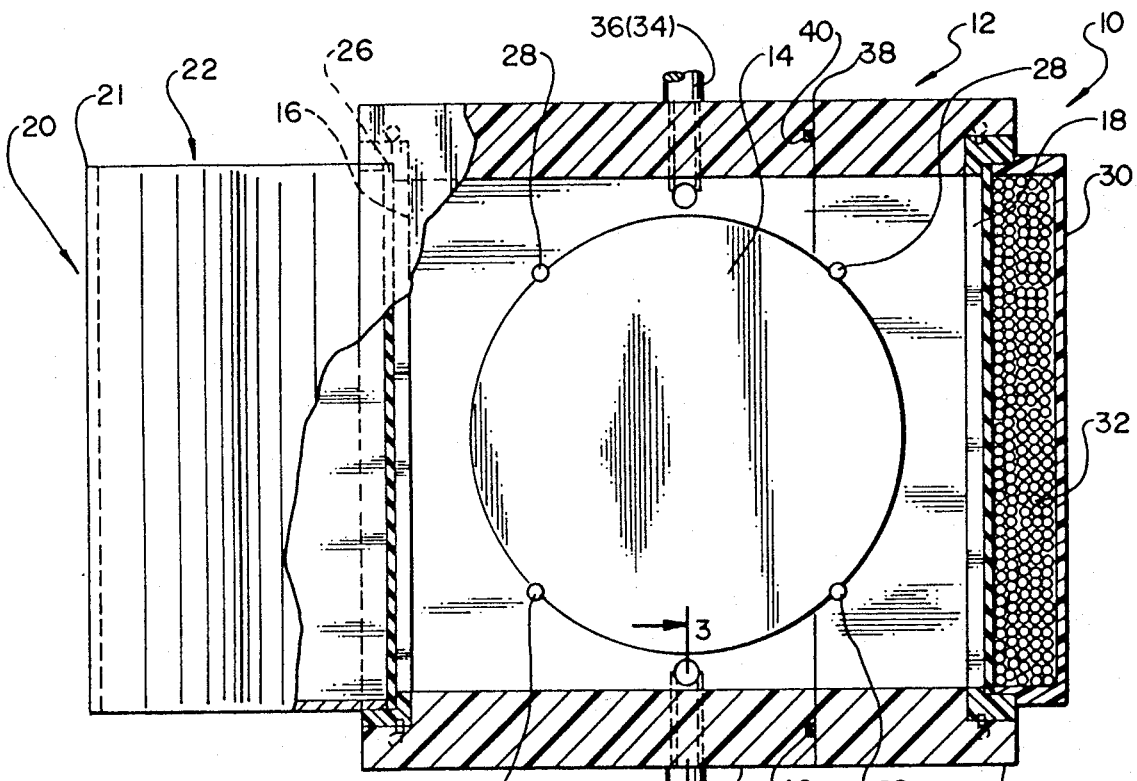
FIG. 1 is a schematic perspective view of the high frequency sonic processing module of the present invention.
Figure 3:
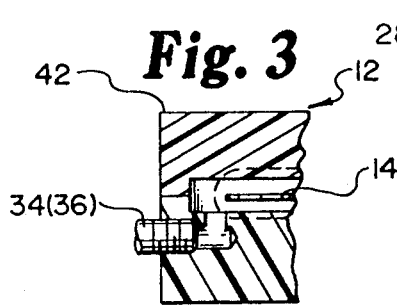
FIG. 3 is a profile of a processing solution inlet (outlet) of the present sonic processing module, taken along line 3—3 of FIG. 1.
Figure 4:
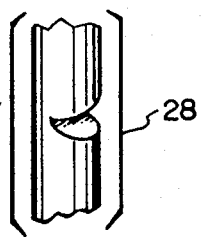
FIG. 4 illustrates the substrate wafer supporting means within the substrate module of FIGS. 1 and 3, in open wafer-receiving position.

FIG. 1 schematically illustrates a high frequency sonic processing module 10 of the present invention in perspective. Substrate chamber 12 is provided for maintaining a substrate 14 immersed in liquid processing solution. Substrate chamber 12 is provided with membranes forming first and second ends 16 and 18 of substrate chamber 12, respectively. The membranes are formed of materials which are inert to any of the standard processing solutions which may be used within chamber 12. Examples of such standard processing solutions include those containing $H_2SO_4$, $H_2O_2$, HCl, HF, $NH_4OH$ and mixtures thereof and any other standard solutions used in processing wafer substrates. The membranes are formed of materials capable of receiving and transmitting megasonic wave energy from an inert, megasonic wave conducting solution exterior to the substrate chamber 12 to the liquid processing solution within substrate chamber 12 and also to the substrate 14 maintained therein. Suitable membranes are readily commercially available, and include FEP Teflon, PFA and KEL-F, with KEL-F the presently preferred membrane material. KEL-F is polychlorotetrafluoroethylene, and is available from 3M of Minnesota.

Figure 2:
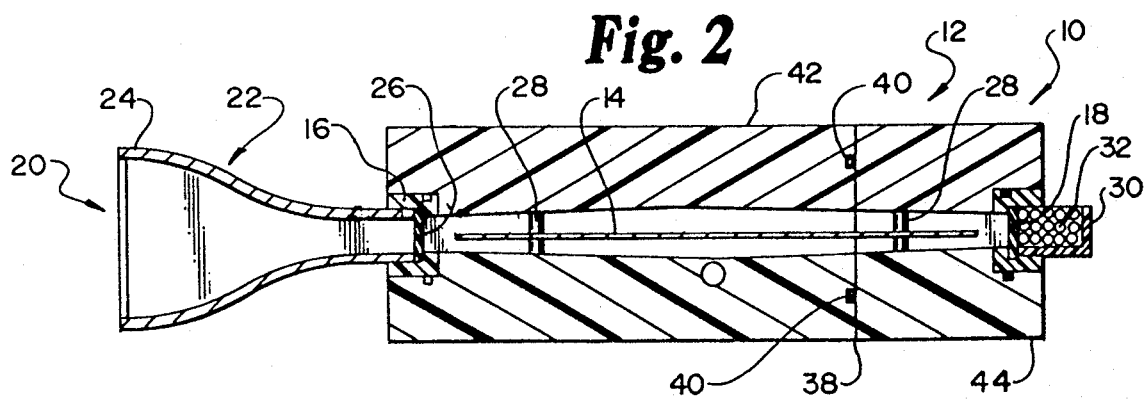
FIG. 2 is a schematic profile of the high frequency sonic processing module shown in FIG. 1.

Exterior to substrate chamber 12 is a sonic wave generating ceramic transducer 20, shown in greater detail in FIG. 2. Sonic wave generating ceramic transducers are well known and are readily commercially available. Suitable such ceramic transducers are available from Channel Industries in Santa Barbara, Calif. and from Vernitron in Cleveland, Ohio. In the illustrative embodiment shown in FIG. 2, sonic wave energy generated by ceramic transducer 20 is conducted through a funnel shaped wave guide 22 from the major to the minor funnel terminus 24 to 26, respectively. Wave guide 22 is filled with an inert, sonic wave conducting liquid medium such as DI water in contact with the first membrane 16 of the substrate chamber 12. The purpose of the funnel shaped wave guide 22 is to concentrate and intensify the sonic wave generated by the ceramic transducer 20. The sonic wave generated by the transducer array 20 is in the range of 800–1500 kilocycles, and is intensified by the wave guide 22 to a range of 5–15 times the wattage density at the face of the transducer 20.

The single substrate wafer 14 is maintained within the substrate chamber 12 supported on its periphery with both surfaces entirely exposed to the processing solution and to the sonic wave. The wafer support members 28 position the wafer 14 within the substrate chamber 12 so that the sonic wave travels across essentially the entire wafer 14 exterior. The interior dimensions of the substrate chamber 12 are designed to closely conform to without contacting the surfaces of the wafer 14 and may be between 2–10 mm, typically 3 mm in height, with the wafer 14 positioned in the center thereof, and with the width and length of the chamber 12 closely sized to the diameter of the wafer substrates, which are typically 100, 150, 200 mm in diameter. In order to continue the intensification and concentration of the sonic wave, the substrate chamber can also be of diminishing cross sectional area along the sonic wave path therethrough. When the chamber is of diminishing cross sectional area, the height of the chamber would be, for example, about 10 mm at the first membrane end, and about 3 mm at the second membrane end, with the angle between the top and bottom of the substrate chamber being about a maximum of 10°.

After the high frequency sonic wave has passed through the substrate chamber 12, the wave is transmitted through the membrane which forms the second end 18 of the substrate chamber 12 into the sonic wave absorbing and dissipating antechamber 30. The antechamber 30 is filled with sonic wave absorbing media in an aqueous environment, such as beads 32, as illustrated in FIGS. 1 and 2, or similar brushes or fibers in DI water. The sonic wave absorbing media is preferably of fluoropolymer.

The substrate chamber 12 is further provided with appropriate inlet and outlet ports for flowing processing solution and ultrapure DI water therethrough. FIGS. 1 and 2 illustrate a single inlet port 34 and/or outlet port 36 positioned to direct a liquid stream through the substrate chamber 12 essentially across the path of the sonic wave. However, it is to be understood the position of the inlets and outlets and the method of filling and draining the substrate chamber 12 is not critical, as long as bubble formation and retention, known to inhibit sonic activity, is essentially minimized in the substrate chamber 12. The ports may be reversible inlet-outlet ports and may be baffled manifold ports. Filling the substrate chamber up from the bottom while maintaining pressure above the entering liquid minimizes bubble formation by maintaining gases in solution. Filling the substrate chamber 12 from the bottom through manifold baffles serves to evenly distribute fluid flow across the substrate 14 and avoid stagnation areas within the substrate chamber 12. Processing solution may be flowed through the substrate chamber 12 during a processing procedure or be a static volume during the process. At completion of a processing cycle, the processing solution is drained and ultrapure DI water is flowed through, so that the wafer is water wet when the substrate chamber 12 is opened for wafer removal.

The substrate chamber may be positioned so that the wafer is vertical rather than horizontal, or at some position between horizontal and vertical. This allows liquids to drain more efficiently from the wafer, permits a more effective seal for the substrate chamber, and allows the interior parts of the substrate chamber to be more easily coated with silicon carbide.

Access to the substrate chamber 12 interior for insertion and removal of wafer substrate 14 may be by any suitable method. As shown in FIG. 1 and 2, the substrate chamber 12 is broken open in the middle along the line 38 for wafer access, a sealing ring 40 provided on the face of the first part of the chamber 42 where it contacts the second part of the chamber 44. The two parts of the chamber 12 are maintained in fluid tight closure by any suitable means, such as screw clamping or pneumatic pressure.

The entire module is maintained in a closed environment. This closed environment allows higher temperatures and pressures to be used than are possible with other sonic processing apparatus, resulting in higher processing efficiency. Temperatures of between 20° to 100° C. and pressures of between 2 to 30 psia are considered desirable, dependent on the particular procedure and processing solution. Heating of the substrate chamber is provided by pre-heating the wafer, the processing solution, or by use of an exothermic processing solution. Pressurizing the substrate chamber is provided by applying pressure to the surface of the entering processing solution to maintain any gases in solution and minimize bubbling. The entire module, including the wave concentrating guide is cooled by circulating crosswise an appropriate cooling fluid, such as deionized water, other clean water source, or fluorocarbons such as freon. The entire module is constructed of synthetic fluoropolymers inert to the effects of the processing solutions and the sonic wave energy, such as PVDF or PF or silicon carbide, silicon nitride, titanium, tantalum, or stainless steel.

The present sonic processing module, utilizing single wafer processing and handling, provides distinct advantages in the areas of production and process control and in uniformity of environment and processing results. Combinations of individual modules are assembled into a single system to provide for simultaneous processing of a plurality of individual wafer substrates.

What is claimed is:

1. A sonic processing module for processing a substrate comprising:
    a substrate chamber for maintaining a substrate immersed in liquid processing solution, said chamber minimally sized to the dimensions of the substrate, and said substrate chamber provided with first and second sonic wave permeable membranes forming first and second ends of said chamber along a sonic wave path through said chamber;
    means exterior to said substrate chamber for generating a sonic wave through a sonic wave conducting liquid medium, said liquid medium being in contact with the first membrane exterior to the substrate chamber, and said liquid medium shaped by a sonic wave guide to intensify and concentrate the sonic wave, said sonic wave being transmitted through said liquid medium and said first membrane to provide sonic excitation to said processing solution to enhance processing of said substrate in the substrate chamber; and
    means exterior to said substrate chamber in contact with the second membrane for absorbing and dissipating said sonic wave after passing through said second membrane.

2. A sonic processing module according to claim 1, wherein the sonic wave guide is of continuously diminishing cross sectional area along the length thereof and along the sonic wave path therethrough.

3. A sonic processing module according to claim 2, wherein the sonic wave guide is funnel shaped.

4. A sonic processing module according to claim 1, wherein the chamber is also of diminishing cross sectional area along the length thereof and along the sonic wave path therethrough to further intensify and concentrate the sonic wave.

5. A sonic processing module according to claim 1, wherein the substrate is a single wafer maintained within the substrate chamber so that the sonic wave travels across essentially the entire diameter of the wafer.

6. A sonic processing module according to claim 1, wherein the substrate chamber is further provided with liquid ports for flowing liquid processing solution therethrough so as to minimize gas bubble retention in the chamber.

7. A sonic processing module according to claim 1, wherein the membranes are formed of fluoropolymer.

8. A sonic processing module according to claim 1, wherein the sonic wave absorbing and dissipating means is sonic wave absorbing media in an aqueous environment.

9. A sonic processing module according to claim 8, wherein the sonic wave absorbing media are beads, fibers or brushes.

10. A sonic processing module according to claim 1, wherein the means for generating a sonic wave is a ceramic transducer array.

11. A sonic processing module according to claim 10, wherein the frequency of the sonic wave generated by the transducer array is in the range of 600 to 2000 kilohertz and is concentrated and intensified by the wave guide to 5 to 15 times the wattage density from the transducer.

12. A sonic processing module according to claim 11, wherein sonic wave frequency is about 800 kilohertz.

13. A sonic processing module according to claim 2, wherein the substrate chamber is maintained at a temperature within the range of 20° to 100° C. and a pressure within the range of 2 to 30 psia.

14. A sonic processing module according to claim 1, wherein the module is cooled by circulating cooling fluid exterior to the module to maintain the temperature therein within the range of 0 to 100 degrees C.

15. A sonic processing module according to claim 1, wherein the processing is cleaning with standard liquid cleaning media.

16. A method for sonic processing of a substrate comprising:
    immersing the substrate in liquid processing solution maintained in a substrate chamber, said chamber closely sized to the dimensions of the substrate, and said chamber provided with first and second sonic wave permeable membranes forming first and second ends of said chamber along a sonic wave path through said chamber;

applying sonic wave energy to the liquid processing solution and the substrate therein from a sonic wave generating means external to said chamber, by directing said wave energy through a sonic wave conducting liquid medium, said liquid medium being in contact with the first membrane exterior to the substrate chamber, and said liquid medium shaped by a sonic wave guide to intensify and concentrate the sonic wave; and absorbing and dissipating said sonic wave energy exiting said chamber through said second membrane.

17. A sonic processing method according to claim 16, wherein the substrate is a single wafer maintained within the substrate chamber so that the sonic wave travels across essentially the entire diameter of the wafer surface.

18. A sonic processing method according to claim 16, wherein the sonic wave guide is of continuously diminishing cross sectional area along the length thereof and along the sonic wave path therethrough.

19. A sonic processing method according to claim 16, wherein the sonic wave guide is funnel shaped.

20. A sonic processing method according to claim 19, wherein the chamber is also of diminishing cross sectional area along the length thereof and along the sonic wave path therethrough to further intensify and concentrate the sonic wave.

21. A sonic processing method according to claim 16, wherein the substrate chamber is further provided with means for flowing liquid processing solution therethrough so as to minimize gas bubble retention in the chamber.

22. A sonic processing method according to claim 16, wherein the membranes are formed of fluoropolymer.

23. A sonic processing method according to claim 16, wherein the means for absorbing and dissipating the sonic wave is sonic wave absorbing media in an aqueous environment.

24. A sonic processing method according to claim 23, wherein the sonic wave absorbing media are beads, fibers or brushes.

25. A sonic processing method according to claim 16, wherein the means for generating a sonic wave is ceramic transducer array.

26. A sonic processing method according to claim 25, wherein the frequency of the sonic wave generated by the transducer array is in the range of 600 to 2000 kilohertz and is concentrated and intensified by the wave guide to 5 to 15 times the wattage density from the transducer.

27. A sonic processing method according to claim 26, wherein sonic wave frequency is about 800 kilohertz.

28. A sonic processing method according to claim 16, wherein the substrate chamber is maintained at a temperature within the range of 20° to 100° degrees C. and a pressure within the range of 2 to 30 psia.

29. A sonic processing method according to claim 16, wherein the module is cooled by circulating cooling fluid exterior to the module to maintain the temperature therein within the range of 0 to 100 degrees C.

30. A sonic processing method according to claim 16, wherein the processing is cleaning with standard liquid cleaning media.

31. A sonic processing system comprising a plurality of modules as described and claimed in claim 1, to provide simultaneous processing of a plurality of substrates.

* * * * *